(12) United States Patent
Daval et al.

(10) Patent No.: US 7,452,792 B2
(45) Date of Patent: Nov. 18, 2008

(54) RELAXATION OF LAYERS

(75) Inventors: Nicolas Daval, Grenoble (FR); Zohra Chahra, Meylan (FR); Romain Larderet, Meylan (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 343 days.

(21) Appl. No.: 11/337,267

(22) Filed: Jan. 19, 2006

(65) Prior Publication Data
US 2007/0099399 A1   May 3, 2007

(30) Foreign Application Priority Data
Oct. 28, 2005   (FR) .................................. 05 11040

(51) Int. Cl.
  *H01L 21/20*   (2006.01)
  *C30B 1/02*    (2006.01)
  *C30B 1/10*    (2006.01)
(52) U.S. Cl. ..................... 438/492; 438/479; 438/509; 117/3; 117/7; 117/9; 117/939
(58) Field of Classification Search .............. 438/479, 438/492, 509, 796; 117/3, 7, 9, 939
See application file for complete search history.

(56) References Cited

U.S. PATENT DOCUMENTS

| 5,759,898  | A  * | 6/1998  | Ek et al. ..................... 438/291 |
| 6,515,335  | B1 * | 2/2003  | Christiansen et al. ....... 257/347 |
| 6,805,962  | B2 * | 10/2004 | Bedell et al. ................ 428/446 |
| 6,833,332  | B2 * | 12/2004 | Christiansen et al. ....... 438/796 |
| 7,217,949  | B2 * | 5/2007  | Chan et al. .................... 257/19 |

(Continued)

FOREIGN PATENT DOCUMENTS

JP    04-345021    12/1992

(Continued)

OTHER PUBLICATIONS

"Silicon-on-Insulator Technology: Materials to VLSI, 2r'd Edition" by Jean-Pierre Colinge, Kluwer Academic Publishers, pp. 50 and 51.

(Continued)

*Primary Examiner*—M. Wilczewski
(74) *Attorney, Agent, or Firm*—Winston & Strawn LLP

(57) ABSTRACT

The invention relates to a method of forming a layer of elastically unstrained crystalline material intended for electronics, optics, or optronics applications, wherein the method is carried out using a structure that includes a first crystalline layer which is elastically strained under tension (or respectively in compression) and a second crystalline layer which is elastically strained in compression (or respectively under tension), with the second layer being adjacent to the first layer. The method includes a step of diffusion between the two layers so that the differences between the respective compositions of the two layers is progressively reduced until they are substantially the same, so that the two layers then form just a single final layer of crystalline material having a composition which, in aggregate, is uniform, and wherein the respective compositions, thicknesses, and degrees of strain of the two layers are initially selected so that, after diffusion, the material then constituting the final layer no longer, in aggregate, exhibits elastic strain. The diffusion can be accomplished by heat treating the structure.

22 Claims, 2 Drawing Sheets

U.S. PATENT DOCUMENTS

Figure 1A:
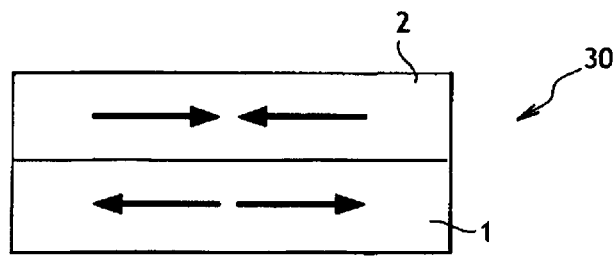

| | | | |
|---|---|---|---|
| 7,265,004 B2* | 9/2007 | Thean et al. | 438/151 |
| 2003/0139000 A1 | 7/2003 | Bedell et al. | 21/337 |
| 2005/0104131 A1 | 5/2005 | Chidambarrao et al. | 257/369 |
| 2007/0059875 A1* | 3/2007 | Mishima | 438/199 |

FOREIGN PATENT DOCUMENTS

| | | |
|---|---|---|
| JP | 2004-189505 A | 7/2004 |
| WO | WO 01/99169 A2 | 12/2001 |
| WO | WO 02/15244 A2 | 2/2002 |
| WO | WO 02/27783 A1 | 4/2002 |
| WO | WO 2004/006326 A1 | 1/2004 |
| WO | WO 2004/006327 A1 | 1/2004 |

OTHER PUBLICATIONS

"High Mobility Si and Ge Structures" by Friedrich Schaffler, Semiconductor Science Technology 12 (1997) 1515-1549.

"Semiconductor Wafer Bonding Science and Technology" by Q.-Y. Tong and U. Gösele—a Wiley Interscience publication, Johnson Wiley & Sons, Inc.

"Strain. Relaxation Kinetics in $Si_{1-z}Ge_z$/Si heterostructures" by D.C. Houghton (J. Appl. Phys. 70 (4), Aug. 15, 1991).

"Defects in Epitaxial Multilayers", J.W. Matthews et al (Journal of Crystal Growth 27 (1974) 118-125).

D. S. Grummon et al., "Stress in Sputtered Films of Near-Equiatomic TiNiX on (100) Si: Intrinsic and Extrinsic Stresses and Their Modification byThermally Activated Mechanisms", Phys. Stat. Sol. (a) 186, No. 1, pp. 17-39 (2001).

* cited by examiner

RELAXATION OF LAYERS

BACKGROUND

The invention relates to the formation of a layer of unstrained crystalline material intended for electronics, optics or optronics applications, and more particularly the invention relates to the production of a structure comprising the layer.

A layer is termed "strained" herein when its crystalline structure is strained elastically under tension or in compression, with the result that its lattice parameter is substantially different from the nominal lattice parameter of its constituent material, the nominal lattice parameter of a material being its lattice parameter when in its bulk form and in its monocrystalline condition. In contrast, a layer is termed "completely relaxed" or "unstrained" if the lattice parameter of its constituent crystalline material is substantially identical to its nominal lattice parameter. Thus, an unstrained layer has a stable crystallographic structure when it is subjected to external stresses such as thermal stresses. It is possible to find such unstrained layers directly in bulk wafers, but the fabrication of bulk material is limited to a small number of materials such as silicon, AsGa, germanium, sapphire and a few others.

To produce unstrained layers of other types of materials, it is known to form such a layer in the same wafer on a bulk substrate constituted by another crystalline material by interposing a buffer layer between the substrate and the layer. In such a configuration, a "buffer layer" is understood to be a transition layer that adapts the lattice parameter of the layer formed with that of the substrate. Such a buffer layer may thus have a composition which varies gradually with depth, the gradual variation in the components of the buffer layer then being directly associated with a gradual variation in its lattice parameter between the respective lattice parameters of the substrate and of the layer formed. An example which can be mentioned is the formation of a layer of SiGe from a bulk silicon substrate via a SiGe buffer layer having a germanium composition that increases progressively between the substrate and the SiGe layer. The "buffer layer" can thus be used to produce unstrained layers constituted by materials which do not exist or rarely exist in the bulk form.

Further, it may be advantageous to integrate the unstrained layers into semiconductor-on-insulator structures, with the resulting structure then comprising the unstrained layer on an electrically insulating layer, wherein the insulating material is comprised of a bulk substrate (such as a glass substrate, for example) or constituting a relatively thick layer (such as a layer of $SiO_2$ or $Si_3N_4$) interposed between the unstrained layer and a subjacent bulk substrate. Such semiconductor-on-insulator structures have better electrical and/or optical properties compared with bulk structures, thereby improving the performance of components produced in the unstrained layer.

A semiconductor-on-insulator layer is typically produced by layer transfer from a donor wafer to a receiver wafer, with the donor wafer possibly being a bulk or composite material, such as a wafer comprising a buffer layer and a sub-epitaxial unstrained layer. The layer transfer techniques generally comprise a wafer bonding step, with the donor wafer being bonded with the receiver wafer, then a step of lifting off or removing part of the donor wafer to leave only the transferred layer on the receiver wafer. The donor wafer may instead be reduced by chemical-mechanical attack of the back portion (for example by polishing, grinding, chemical-mechanical planarization, chemical etching, selective chemical etching, etc) using techniques known as "polish-back" and/or "etch-back." It also can be removed by splitting or detaching the donor wafer after atomic implantation at the zone which is to be cut, using a technique termed SMART-CUT®. This technique is generally known to the skilled artisan (by way of example, reference may be made to the work entitled "Silicon-on-Insulator Technology: Materials to VLSI, $2^{nd}$ Edition" by Jean-Pierre Colinge, Kluwer Academic Publishers, pp 50 and 51).

Various examples of these techniques have been described. A technique for transferring a layer of unstrained SiGe from a composite donor wafer comprising a buffer layer using an etch-back technique is described in International patent application WO01/99169. However, this unstrained layer transfer technique is lengthy, expensive, and results in the loss of the donor wafer following transfer.

WO02/27783 describes a SMART-CUT® technique for transferring an unstrained SiGe layer. That technique allows the lifted portion of the donor wafer to be recovered for possible recycling. However, the layer transfer cannot ensure perfect homogeneity of its thickness, and an additional polishing step has to be carried out to increase the short range homogeneity. The polishing step reduces the long range homogeneity (i.e., the homogeneity measured between the center and edges of the wafer).

WO02/15244 and WO04/006327 describe a method of transferring a layer of unstrained SiGe from a donor wafer that includes a layer of strained Si between the buffer layer and the unstrained SiGe layer. The method consists in transferring the unstrained SiGe layer and the strained Si layer onto a receiver wafer, and then selectively removing the strained Si as opposed to the unstrained SiGe layer. That method produces a final layer of unstrained SiGe having short and long range homogeneity using the SMART-CUT® technique and without having to carry out final polishing. During transfer of the strained Si layer, however, heat treatments are applied, and this may cause diffusion of germanium into the strained Si layer, thus reducing the selectivity between the strained Si and the unstrained SiGe which is necessary for final chemical etching. Given that a strained Si layer is thin, this loss of selectivity may lead to the unstrained SiGe layer being attacked, and thus to a reduction in its quality and in its short range thickness homogeneity.

Thus, improvements in these existing procedures are desired.

SUMMARY OF THE INVENTION

The invention relates to a new and improved method of forming a layer of elastically unstrained crystalline material. This method comprises providing first and second crystalline layers adjacent each other, wherein one layer is elastically strained under tension and the other layer is elastically strained in compression and then providing a step of diffusion between the layers so that the differences between the respective compositions of the two layers reduces progressively until they are substantially the same. The result is that the two layers then form just a single final layer of crystalline material having, in aggregate, a uniform composition. Also, the respective compositions, thicknesses, and degrees of strain of the two layers are initially selected so that, after diffusion, the material then constituting the final layer no longer, in the aggregate, exhibits elastic strain.

Another embodiment of the invention relates to a method of producing a structure that includes an elastically unstrained crystalline layer. This method comprises crystal growing a second crystalline layer on a first crystalline layer wherein one layer is elastically strained under tension and the other layer is elastically strained in compression and with the second layer having a thickness that is selected to be a reference thickness which corresponds to a thickness for which elements of the first and second layers once combined together, can form a uniform layer which, in aggregate, is unstrained. This is followed by a step of diffusing the elements between the two layers so that the differences between the respective compositions of the two layers is progressively reduced until they are substantially the same, the two layers then forming just a single final layer of a crystalline material having a composition which, in aggregate, is uniform and elastically unstrained, producing at least part of the structure.

By these techniques, layers of elastically unstrained crystalline material can be easily and successfully provided.

BRIEF DESCRIPTION OF THE DRAWING FIGURES

Figure 1B:
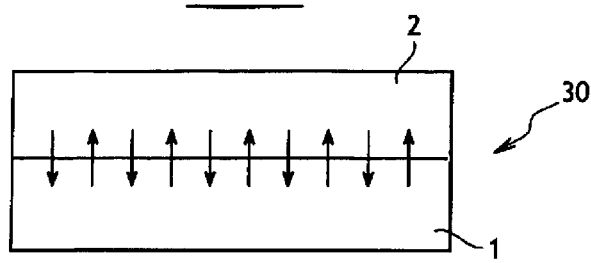
Figure 1C:
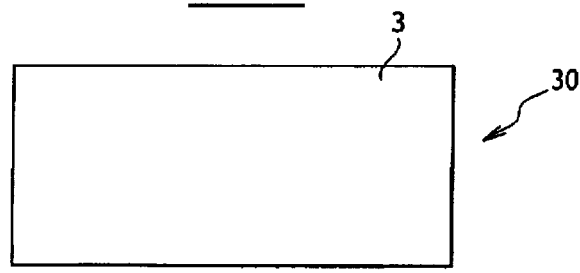

Other characteristics, aims, and advantages of the invention are described in the following detailed description, preferred aspects of which are illustrated by the following figures:

FIGS. 1A and 1C represent different steps in a method in accordance with the invention for producing a structure comprising an unstrained layer.

Figures 2A, 2B:
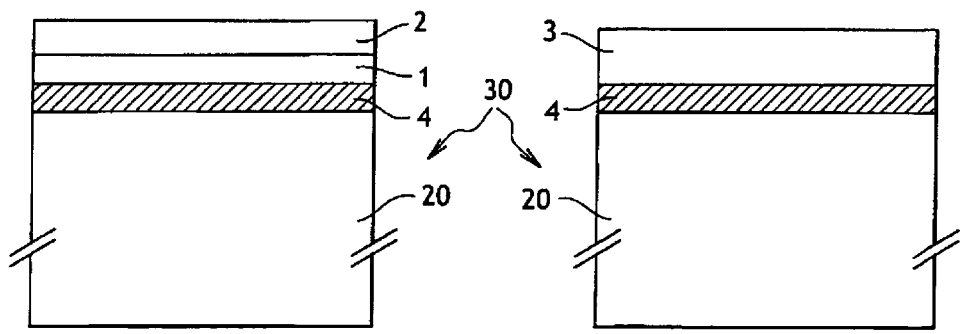

FIGS. 2A and 2B respectively represent a semiconductor-on-insulator structure before and after diffusion in accordance with the invention.

FIGS. 3A to 3E represent different steps in a method in accordance with the invention for producing a particular structure comprising an unstrained layer.

DETAILED DESCRIPTION OF THE PREFERRED EMBODIMENTS

A principal aim of the invention is to overcome the disadvantages of the prior art by providing a method of forming a completely relaxed layer having good thickness homogeneity. A further aim is to produce a semiconductor-on-insulator layer having a layer of unstrained crystalline material and having good thickness homogeneity.

The invention achieves these aims by forming a layer of elastically unstrained crystalline material intended for electronics, optics, or optronics applications. This method is implemented from a structure comprising a first crystalline layer which is elastically strained under tension (or respectively in compression) and a second crystalline layer which is elastically strained in compression (or respectively under tension), with the second layer being adjacent to the first layer. The method comprises a step of diffusion between the two layers so that the differences between the respective compositions of the two layers reduces progressively until they are identical, the two layers then forming just a single final layer of crystalline material having, in aggregate, a uniform composition. Also, the respective compositions, thicknesses, and degrees of strain of the two layers are initially selected so that, after diffusion, the material then constituting the final layer no longer, in aggregate, exhibits elastic strain.

Other preferred characteristics of this method of forming the unstrained layer are as follows:
- the lattice parameters of the first and second strained layers are respectively equal to the nominal lattice parameter of the material constituting the final layer;
- the second layer is a layer which is epitaxially grown on the first layer;
- the first and second layers have at least one element in their respective compositions in common;
- the first layer is formed from $Si_{1-x}Ge_x$, the second layer is formed from $Si_{1-y}Ge_y$, and the final layer is formed from $Si_{1-z}Ge_z$, with x an y respectively being in the range of 0 to 1 inclusive, with x being substantially different from y, and with z satisfying the relationship:

$$z=(x*th_1+y*th_2)/(th_1+th_2)$$

where $th_1$ is the thickness of the first layer;
$th_2$ is the thickness of the second layer; and
the respective lattice parameters of the first and second strained layers are respectively equal to the nominal lattice parameter of $Si_{1-z}Ge_z$;
- the structure may further comprise a layer of amorphous material located beneath the two crystalline layers, with the layer of amorphous material being an electrically insulating material;
- the layer of amorphous material preferably comprises at least one of the following materials: $SiO_2$, $Si_3N_4$, $Si_xO_yN_z$;
- diffusion is preferably carried out by a heat treatment.

In a second aspect, the invention provides a method of producing a structure comprising an elastically unstrained crystalline layer intended for electronics, optics, or optronics applications, comprising the following steps:
- crystal growing a second crystalline layer on a first crystalline layer which is elastically strained under tension (or respectively in compression), so that the second layer is elastically strained in compression (or respectively under tension) by the first layer, and so that the thickness of the second layer is selected to be of the order of a reference thickness, the reference thickness corresponding to a thickness for which the assembly of elements composing the second layer and the assembly of elements composing the first layer, once combined together, can form a uniform layer which, in aggregate, is unstrained;
- diffusing elements between the two layers so that the differences between the respective compositions of the two layers is progressively reduced until they are identical, the two layers then forming just a single final layer of a crystalline material having a composition which, in aggregate, is uniform and elastically unstrained, producing at least part of the structure.

Further characteristics of this method are as follows:
- the lattice parameter of the first layer is selected so as to be substantially equal to the nominal parameter of the material composing the final layer;
- crystalline growth is also carried out so that the thickness of the second layer is less than or equal to a critical thickness beyond which elastic strains would substantially relax;
- further, before the crystalline growth step, the first layer is bonded with a receiver substrate, the structure which is finally formed thus comprising the final layer and also the receiver substrate;
- bonding is carried out via a bonding layer formed on one and/or the other of the faces to be bonded;
- the bonding layer comprises at least one of the following two materials: $SiO_2$, $Si_3N_4$;
- bonding is molecular and is then reinforced by a suitable heat treatment;
- the first layer is comprised in a wafer at the time of bonding, and the method further comprises, between the bonding and crystalline growth steps, lifting off the portion of the wafer which does not comprise the first layer;
- the portion of the wafer which does not comprise the first layer is lifted off by means of at least one of the following techniques: grinding, chemical mechanical planarization (CMP), selective CMP, chemical etching, selective chemical etching;

prior to bonding, the method further comprises implanting atomic species into the wafer to create therein a zone of weakness at a depth which is substantially equal to the thickness of the first layer; and the wafer portion is lifted off by subjecting the zone of weakness to stresses which are capable of rupturing the weak bonds and thereby detaching the first layer from the remainder of the wafer;

further, between lifting off part of the wafer and crystalline growth, a step of finishing the surface of the first layer is carried out to prepare its surface for crystalline growth of the second layer;

the first layer is formed from $Si_{1-x}Ge_x$, the second layer is formed from $Si_{1-y}Ge_y$ and the final layer is formed from $Si_{1-z}Ge_z$, with x an y respectively being in the range of 0 to 1 inclusive, with x being substantially different from y, and with z satisfying the relationship:

$$z=(x*th_1+y*th_2)/(th_1+th_2)$$

where $th_1$ is the thickness of the first layer;
$th_2$ is the thickness of the second layer; and
the respective lattice parameters of the first and second strained layers are respectively equal to the nominal lattice parameter of $Si_{1-z}Ge_z$;

the first layer may be formed from strained Si and be part of a strained silicon-on-insulator substrate (sSOI).

The methods of the invention generally comprise a step of diffusion between two elastically strained crystalline layers to form a single final crystalline layer with an elastically unstrained homogeneous composition. In FIG. 1A, the unstrained layer is formed from a structure 30 comprising a first crystalline layer elastically strained under tension 1 (tension being shown diagrammatically in the figure by diverging arrows) and a second crystalline layer elastically strained in compression 2 (compression being shown in the figure by converging arrows), the second layer 2 being adjacent to the first layer 1. In an alternative configuration of the invention, the first layer 1 may, in contrast, be in compression and the second layer 2 is under tension, without in any way modifying the diffusion step which is then carried out. The structure 30 may be formed only by two layers 1, 2, or it may comprise a support (such as a stiffener or a growth substrate) on one side of one and/or the other of the two layers 1, 2.

In a first configuration, the layer 2 has the characteristics of a layer which has been epitaxially grown on the layer 1, this layer then being a growth substrate. Alternatively, the layer 1 may have the characteristics of an epitaxially grown layer on the layer 2, the layer then acting as a growth substrate. Crystalline growth of the epitaxial layer may have been obtained using the known techniques of LPD, CVD and MBE (respectively low power deposition, chemical vapor deposition, and molecular beam epitaxy).

To avoid the appearance of plastic type defects in the epitaxially grown layer while guaranteeing the desired elastic strain, it is desirable for the thickness of the epitaxially grown layer to be below a critical thickness essentially determined as a function of differences in the nominal lattice parameters of the respective materials composing the two layers 1, 2. This critical thickness can be determined from prior knowledge and publications. As an example, reference could be made to the document "High Mobility Si and Ge Structures" by Friedrich Schäffler ("Semiconductor Science Technology" 12 (1997) 1515-1549) to determine the critical thickness of a layer 1 of $Si_{1-x}Ge_x$, and for a layer 2 of $Si_{1-y}Ge_y$ (with x being different from y).

In a second configuration, the layers 1, 2 have been bonded together using known bonding techniques (see, for example, "Semiconductor Wafer Bonding Science and Technology" by Q.-Y. Tong and U. Gösele—a Wiley Interscience publication, Johnson Wiley & Sons, Inc.—for more details). Thus, for example, molecular bonding of hydrophilic surfaces or surfaces rendered hydrophilic may be selected, or bonding after plasma treatment of one and/or the other of two surfaces to be bonded, followed by conventional annealing or RTA treatment (rapid thermal annealing).

In the case in which the two layers 1, 2 have been bonded to each other, it is essential to select bonding techniques which are not susceptible to hindering diffusion between the two layers 1, 2. The diffusion step is then carried out in accordance with the invention. In particular, care is taken to prepare, in known manner, the surfaces to be bonded to smooth them and clean them effectively so that they have no contaminants or isolated particles which may perturb diffusion. Chemical treatments which are adapted to cleaning surfaces to be bonded may be carried out, such as weak chemical etching, RCA treatment, ozone baths, rinsing, etc. Mechanical or chemical-mechanical treatments may also be carried out, such as polishing, abrasion, CMP (chemical mechanical planarization) or atomic species bombardment. Further, bonding may be carried out without a bonding layer (of the $SiO_2$ or $Si_3N_4$ type, for example) or with a bonding layer which is sufficiently thin that it cannot substantially prevent or slow diffusion between the two layers 1, 2.

The respective compositions, thicknesses and degrees of strain of the two layers 1, 2 are selected so that, after carrying out diffusion, the material then constituting the final unstrained layer to be formed is no longer, in aggregate, elastically strained. In particular, the lattice parameter of strained layers 1, 2 are advantageously respectively equal to the nominal lattice parameter of the material constituting the final layer that is to be formed. In particular, the respective compositions and thicknesses of the strained layers 1, 2 are advantageously selected so that, once homogenization by diffusion of the two layers 1, 2 into a final layer has been achieved, the final layer has the desired composition.

Referring to FIG. 1B, the method comprises a step of diffusion between the two layers 1, 2 so that the differences between their respective compositions are progressively reduced.

This phenomenon thus entrains displacements between the layers 1, 2 of the constituent elements of their materials, to progressively reduce their differences in compositions (the displacements between the layers 1, 2 being shown in the figure by arrows).

Diffusion is advantageously carried out by heat treatment, adapted to one or more predetermined temperature(s) respectively during one or more time period(s) to obtain the desired result, i.e. a final elastically unstrained layer. As an example, heat treatment may be carried out at a temperature in the range 900° C. to 1200° C. for 30 minutes (min) to a few hours (h). FIG. 1C shows the result obtained after carrying out diffusion: the respective compositions of the two layers 1, 2 are substantially identical to each other, the two layers 1, 2 then forming just a single final layer 3 formed from a crystalline material having a composition which is uniform and elastically unstrained.

In a particular configuration of the invention, the materials constituting the layers 1, 2 may initially have at least one element of their respective compositions in common. Thus, if the composition of one of the two layers 1 or 2 is such that it comprises more of that element than the other layer, more diffusion of that element will occur from that first layer towards the other layer to homogenize the composition of the assembly. As an example, consider that the first layer 1 is formed from $Si_{1-x}Ge_x$, the second layer is formed from $Si_{1-y}Ge_y$. According to the invention, their thicknesses and degrees of strain (i.e. their respective lattice parameters depending on their compositions) will be selected to obtain a final layer 3 of unstrained $Si_{1-z}Ge_z$, (where x and y are respectively in the range of 0 to 1 inclusive, and where x is substantially different from y):

then, x, y, $th_1$ and $th_2$ will be selected so that:

$$z=(x*th_1+y*th_2)/(th_1+th_2) \quad (1)$$

with $th_1$ being the thickness of the first layer 1; and $th_2$ being the thickness of the second layer 2.

Thus, the respective lattice parameters of the first and second layers strained 1, 2 are respectively equal to the nominal lattice parameter of $Si_{1-z}Ge_z$. Clearly, care must be taken so that $th_1$ and $th_2$ are respectively smaller than the critical thicknesses of layers 1, 2.

FIG. 2A shows a particular implementation of the invention in the case in which the structure 30 is initially a sSOI (strained silicon-on-insulator) structure, thus comprising a first layer 1 of strained Si and a bulk insulating substrate in a first configuration (not shown), or a first layer 1 of strained Si, a bulk substrate 20 and an interposed insulating layer 4 in a second configuration (as shown). This type of sSOI substrate 30 is commercially available. In this example, the degree of strain of the first layer 1 of Si is fixed by selecting a sSOI substrate 30 with a predetermined degree of strain. The lattice parameter of the final layer 3 to be formed is thereby selected.

In a second step, the composition of the second layer 2 to be epitaxially grown and the respective thicknesses of the first layer 1 (which may then optionally be modified) and the second layer 2 are selected to form a final layer 3 having, after homogenizing the two layers 1-2 by diffusion, a nominal lattice parameter equal to that of the first layer 1. As an example, if the composition of the second layer 2 is selected to be $Si_{1-y}Ge_y$, simple epitaxial growth of the second layer of $Si_{1-y}Ge_y$ on the sSOI substrate 30 by selecting, in accordance with the invention, its thickness by reference to the thickness of the first layer 1 (see relationship (1) above), followed by a simple step of diffusion by heat treatment in accordance with the invention, a final layer 3 of unstrained $Si_{1-z}Ge_z$ could be obtained.

The initial choice of the composition of $Si_{1-y}Ge_y$ may also be guided by limitations as regards the critical thickness. In fact, if a concentration y of Ge of more than a predetermined limiting concentration is selected, the thickness $th_2$ to be selected to finally form a layer 3 of unstrained $Si_{1-z}Ge_z$, is greater than the critical thickness. A second layer 2 is thereby obtained with plastic strain relaxations (dislocations, stacking faults and/or other plastic defects); thus, the final layer 3 is of poor crystalline quality.

Certain conditions for epitaxial growth, such as those described in "Strain Relaxation Kinetics in $Si_{1-z}Ge_z$/Si Heterostructures" by D. C. Houghton (J. Appl. Phys. 70 (4), 15 Aug. 1991) can, however, produce crystalline growth of the layer beyond the theoretical critical thickness; reference should be made to "Defects in Epitaxial Multilayers", J. W. Matthews et al (Journal of Crystal Growth 27 (1974) 118-125), which describes the physical phenomena appearing beyond the critical thickness, and the influence of deposition techniques on the appearance of such phenomena. From the structure 30 thus formed, diffusion in accordance with the invention is then carried out. As an example, it is possible to select a temperature of about 1050° C. for about 2 hours.

FIGS. 3A to 3E we show several steps in a further particular method in accordance with the invention, comprising the following steps:

(1) epitaxial growth of a first thin layer 1 of elastically strained crystalline material on a donor surface 10;

(2) bonding a receiver substrate 20 with the donor substrate 10 at the strained layer 1;

(3) lifting off or detaching the donor surface 10;

(4) crystalline growth of a second elastically strained layer 2;

(5) diffusion in accordance with the invention.

Figure 3A:
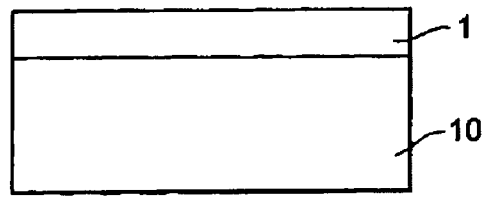

FIG. 3A shows a wafer constituted by a donor substrate 10 and a first strained layer 1 of $Si_{1-x}Ge_x$ (where x is in the range of 0 to 1 inclusive). In one configuration of the donor substrate 10, it is a pseudo-substrate comprising a buffer layer (as defined above) on a support substrate (not shown in FIG. 3A). The buffer layer of SiGe may thus, for example, be formed by epitaxy from a support substrate of bulk monocrystalline Si and, in aggregate, has an increase in its Ge concentration through its thickness, so as to gradually modify the nominal lattice parameter of the Si of the support substrate and that of a SiGe. The buffer layer is arranged so as to further comprise an upper layer of relaxed $Si_{1-w}Ge_w$ (where w differs from x) having a predetermined lattice parameter and having a thickness which is sufficiently great to be able to impose its lattice parameter on the subjacent strained first layer 1 without that layer 1 substantially influencing the upper layer's crystalline structure.

Regardless of the configuration selected for the donor substrate 10, the substrate 10 has a crystalline structure which induces elastic stresses and a low density of plastic defects in the strained layer 1. Since Ge has a lattice parameter which is more than 4.2% greater than Si, the material selected to constitute the strained layer 1 is thus strained under tension if x is smaller than w, and is in compression if w is less than x.

The first strained layer 1 is advantageously formed on the donor substrate 10 by crystalline growth, such as epitaxy using the known techniques of LPD, CVD and MBE. It is preferable to deposit the layer 1 so that it has a substantially constant thickness, so that it has substantially constant intrinsic properties and/or to facilitate future bonding with the receiver substrate 20 (as shown in FIG. 3B).

To prevent relaxation of the strained layer 1 or the appearance of internal plastic type defects, it is preferable to keep the thickness of this layer 1 below a critical thickness for elastic strain. Regarding critical thickness values for layers of $Si_{1-x}Ge_x$, reference should be made in particular to the document entitled "High Mobility Si and Ge Structures" by Friedrich Schäffler ("Semiconductor Science Technology" 12 (1997) 1515-1549). For other materials, the skilled person will refer to the prior art for the critical thickness for elastic strain of the material selected for the strained layer 1 formed on the donor substrate 10. Thus, a layer of $Si_{1-x}Ge_x$(x in the range 0.10 to 0.30) epitaxially grown on relaxed Si has a typical thickness in the range about 200 Å to 2000 Å, and preferably is in the range of 200 Å to 500 Å, in particular by adapting the growth parameters. Once formed, the strained layer 1 thus has a lattice parameter which is substantially close to that of its growth substrate 10 and has a lattice parameter which is substantially equal to the lattice parameter of the unstrained layer which is to be formed in accordance with the invention.

Figure 3B:
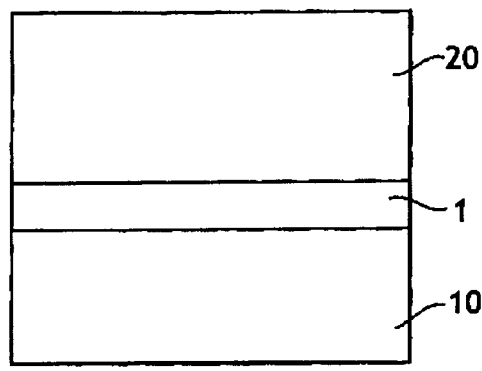

FIG. 3B shows bonding of the donor substrate 10 with the receiver substrate 20. Before bonding, an optional step of forming a bonding layer on at least one of the two surfaces to be bonded may be carried out, the bonding layer having binding properties at ambient temperature or at higher temperatures. Thus, for example, forming a layer of $SiO_2$ or $Si_3N_4$ may improve the bonding quality, in particular if the other surface to be bonded is formed from $SiO_2$ or contains Si. A $SiO_2$ bonding layer is then advantageously produced by depositing atomic species of $SiO_2$ or by thermal oxidation of the surface to be bonded if the surface thereof contains Si.

A step of preparing the surfaces to be bonded is advantageously carried out prior to bonding to render the surfaces as smooth as possible and as clean as possible. The bonding operation per se is carried out by bringing the surfaces to be bonded into contact. The bonds are preferably molecular in nature, exploiting the hydrophilic properties of the surfaces to be bonded. The bonding surfaces may also be plasma treated.

The bonded assembly may be annealed to reinforce the bonds, for example by modifying the nature of the bonds, such as covalent bonds or other bonds. Thus, annealing may accentuate the bonds, in particular if a bonding layer has been formed prior to bonding. Additional details regarding bonding techniques may be obtained from the document entitled "Semiconductor Wafer Bonding Science and Technology", Interscience Technology) by Q. Y. Tong, U. Gösele, Wiley.

Figure 3C:
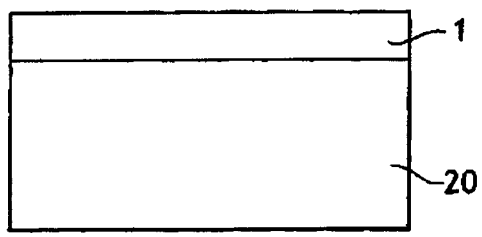

Referring to FIG. 3C, once the assembly is bonded, the donor substrate 10 is removed. The strain in the first layer 1 is thus essentially conserved due to binding forces (see, in particular, WO04/006326, hereby incorporated by reference, for further details). In one implementation, the material is removed by detaching at least part of the donor substrate 10 at a zone of weakness present in the donor substrate 10, by supplying energy. This zone of weakness (not shown) is a zone substantially parallel to the bonding surface, having weakened bonds therein, the weak bonds being capable of being ruptured when a suitable amount of energy is supplied, such as thermal and/or mechanical energy.

The zone of weakness is preferably formed by implanting atomic species into the donor substrate 10. The implanted species may be hydrogen, helium, a mixture of the two species or other, preferably light, species. The implantation may be carried out before bonding, and before or after forming the strained layer 1. The bonds in the zone of weakness are principally weakened by the choice of the dose of implanted species. In the case of hydrogen implantation, the dose is typically in the range $10^{16}$ $cm^{-2}$ to $10^{17}$ $cm^{-2}$, and more precisely in the range from about $2 \times 10^{16}$ $cm^{-2}$ to about $7 \times 10^{16}$ $cm^{-2}$.

Detachment at the zone of weakness is then normally carried out by supplying mechanical and/or thermal energy. For more details regarding this SMART-CUT® method, reference should be made to the document entitled "Silicon-on-Insulator Technology: Materials to VLSI, $2^{nd}$ Edition" J.-P. Colinge, published by "Kluwer Academic Publishers", pp 50 and 51.

After detachment at the zone of weakness, the optional remaining portion of the donor substrate 10 is removed so as to retain only the strained layer 1 on the receiver substrate 20. Finishing techniques such as polishing, abrasion, CMP, RTA, sacrificial oxidation, chemical etching, used alone or in combination, may then be carried out (reinforcement of bonding interface, elimination of roughness, curing defects, etc). Advantageously, finishing material removal employs, at least at the end, a selective chemical etch, in combination or otherwise with mechanical means.

Alternatively, a further technique for removing material without detachment and without a zone of weakness may be carried out for the step of lifting off or detaching the donor substrate 10. It consists of carrying out chemical etching and/or chemical-mechanical etching. As an example, it is possible to selectively etch the material or materials of the donor substrate 10 to be lifted off, using an "etch-back" type method. That technique consists of etching the donor substrate 10 "from the back", i.e. from the free face of the donor substrate 10. Wet etches employing etching solutions adapted to the materials to be removed may be carried out. Dry etching may also be employed to remove material, such as plasma etches or by sputtering. The etch or etches may be preceded or followed by mechanical attack of the donor substrate 10, such as grinding, polishing, mechanical etching or atomic species sputtering. The etch or etches may be accompanied by mechanical attack, such as polishing, optionally combined with the action of mechanical abrasives in a CMP method. All of the techniques for removing material from the donor substrate 10 are proposed by way of example in the present document, but do not in any way constitute a limitation, the invention extending to all types of techniques that can remove the donor substrate 10, in accordance with the method of the invention.

Figures 3D, 3E:
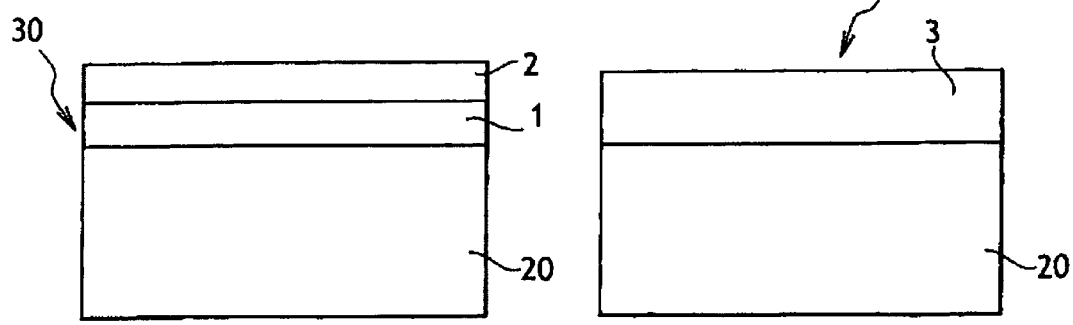

Referring to FIG. 3D, epitaxy in accordance with the invention of a second strained layer 2 of $Si_{1-y}Ge_y$ is carried out, as described above. If the first layer 1 is strained under tension (i.e. if x is smaller than w), the second layer 2 is selected so that it is in compression (i.e., y is greater than w). Consequently, if the first layer 1 is in compression (i.e. if x is greater than w), then the second layer 2 is selected so that it is under tension (i.e., y is smaller than w). The choice of compositions, thicknesses and lattice parameters is determined in accordance with that explained above. Alternatively, the second layer 2 may be epitaxially grown on the first layer 1 before bonding, bonding then being carried out at the surface of the layer 2. This produces a structure 30 having, in succession, the receiver substrate 20, the layer 2 then the layer 1 (in contrast to FIG. 3D).

Referring to FIG. 3E, a diffusion heat treatment in accordance with the invention is carried out, to form a structure 30 having a final layer 3 of $Si_{1-z}Ge_z$. The structure is a SiGeOI structure in the case in which the receiver substrate 20 is an electrical insulator or a sufficiently thick bonding layer is comprised between the layer 3 of $Si_{1-z}Ge_z$ and the receiver substrate 20.

Once the final structure 30 is obtained, finishing treatments may be carried out, for example an anneal. Electronic, optic and optronic components may then be produced in the final layer 3. One or more epitaxial growth steps of any kind may also be carried out on the final structure 30 (refer to FIG. 1C, 2B or 3E), such as epitaxial growth of a layer of SiGe or SiGeC, or epitaxy of a layer of strained SiC or Si, or successive epitaxies of alternating SiGe or SiGeC layers and layers of strained SiC or Si to form a multilayered structure.

The present invention is not limited to strained layers 1, 2 of Si or SiGe, but also extends to other types of materials, such as III-V or II-VI type alloys, or to other crystalline materials. In the crystalline layers discussed here, other constituents may be added, such as doping elements or carbon with a concentration of carbon in the layer under consideration which is 50% or substantially lower or, more particularly, with a concentration of 5% or less.

What is claimed is:

1. A method of forming a layer of elastically unstrained crystalline material, which method comprises: providing first and second crystalline layers of different composition adjacent each other, wherein one layer is elastically strained under tension and the other layer is elastically strained in compression; providing a step of diffusion of at least one element between the layers so that the compositional differences between the respective compositions of the two layers reduces progressively until they are substantially the same, the two layers then forming just a single final relaxed layer of crystalline material having, in aggregate, a uniform composition, and wherein the respective compositions, thicknesses, and degrees of strain of the two layers are initially selected so that, after diffusion, the material then constituting the final layer no longer, in the aggregate, exhibits elastic strain; wherein one layer is formed from $Si_{1-x}Ge_x$, the other layer is formed from $Si_{1-y}Ge_y$ and the final relaxed layer is formed from $Si_{1-z}Ge_z$, with x and y respectively being in the range of 0 to 1 inclusive and z being above 0 but less than 1.

2. The method of claim 1, wherein the lattice parameters of the first and second strained layers are respectively equal to the nominal lattice parameter of the material constituting the final layer.

3. The method of claim 1, wherein the second layer is a layer which is epitaxially grown on the first layer.

4. The method of claim 1, wherein the first and second layers have at least one common element in their respective compositions, and the diffusion step includes a heat treatment carried out at a temperature in the range 900° C. to 1200° C. for about 30 minutes to about 2 hours.

5. The method of claim 1, wherein the first layer is formed from $S_{1-x}Ge_x$, the second layer is formed from $Si_{1-y}Ge_y$ and the final layer is formed from $Si_{1-z}Ge_z$, with x and y respectively being in the range of 0 to 1, and x being substantially different from y, and with z satisfying the formula:

$$z=(x*th_1+y*th_2)/(th_1+th_2)$$

wherein $th_1$ is the thickness of the first layer;
$th_2$ is the thickness of the second layer;
and the respective lattice parameters of the first and second strained layers are respectively equal to the nominal lattice parameter of $Si_{1-z}Ge_z$.

6. The method of claim 1, wherein the structure further comprises a layer of amorphous material located beneath the first and second crystalline layers.

7. The method of claim 6 wherein the layer of amorphous material is of an electrically insulating material.

8. The method of claim 7, wherein the layer of amorphous material comprises $SiO_2$, $Si_3N_4$, or $Si_xO_yN_z$.

9. The method of claim 1, wherein the diffusion is carried out by heat treating the first and second crystalline layers.

10. A method of producing a structure that includes an elastically unstrained crystalline layer, which comprises:
crystal growing a second crystalline layer on a first crystalline layer wherein one layer includes Si that is elastically strained under tension and the other layer includes SiGe that is elastically strained in compression and with the second layer having a thickness that is selected to be a reference thickness which corresponds to a thickness for which elements of the first and second layers once combined together, can form a uniform SiGe layer which, in aggregate, is unstrained;
diffusing the elements between the two layers so that the differences between the respective compositions of the two layers is progressively reduced until they are substantially the same, the two layers then forming just a single final layer of a relaxed SiGe crystalline material having a composition which, in aggregate, is uniform and elastically unstrained, producing at least part of the structure.

11. The method of claim 10, wherein the lattice parameter of the first layer is selected so as to be substantially equal to the nominal lattice parameter of the material composing the final layer.

12. The method of claim 10, wherein crystalline growth is also carried out so that the thickness of the second layer is less than or equal to a critical thickness beyond which elastic strains would substantially relax.

13. The method of claim 10, which further comprises, before the crystalline growth step, bonding the first layer with a receiver substrate, the structure which is finally formed thus comprising the final layer and also the receiver substrate.

14. The method of claim 13, wherein bonding is carried out by providing a bonding layer on one of the first or second layer surfaces to be bonded, or on both.

15. The method of claim 14, wherein the bonding layer comprises $SiO_2$ or $Si_3N_4$.

16. The method of claim 13, wherein bonding is molecular and which further comprises reinforcing the bonding by a heat treatment.

17. The method of claim 13, wherein the first layer forms part of a wafer at the time of bonding, and the method further comprises, between the bonding and crystalline growth steps, removing a portion of the wafer which does not include the first layer.

18. The method of claim 17, wherein the portion of the wafer is removed by grinding, CMP, selective CMP, chemical etching, or selective chemical etching.

19. The method of claim 17, which further comprises, prior to bonding, implanting atomic species into the wafer to create therein a zone of weakness at a depth which defines the first layer; and removing the portion of the wafer by detachment at the zone of weakness.

20. The method of claim 17, which further comprises, between removing the portion of the wafer and the crystalline growth, a step of finishing the surface of the first layer to prepare it for crystalline growth of the second layer.

21. The method of claim 10, wherein the first layer is comprised in a strained silicon-on-insulator substrate (sSOI), and the diffusion step includes a heat treatment carried out at a temperature in the range 900° C. to 1200° C. for about 30 minutes to about 2 hours.

22. A method of forming a layer of elastically unstrained crystalline material, which method comprises: providing first and second crystalline layers adjacent each other, wherein one layer is elastically strained under tension and the other layer is elastically strained in compression; providing a step of diffusion between the layers so that the differences between the respective compositions of the two layers reduces progressively until they are substantially the same, the two layers then forming just a single final layer of crystalline material having, in aggregate, a uniform composition, and wherein the respective compositions, thicknesses, and degrees of strain of the two layers are initially selected so that, after diffusion, the material then constituting the final layer no longer, in the aggregate, exhibits elastic strain, wherein the first layer is formed from $Si_{1-x}Ge_x$, the second layer is formed from $Si_{1-y}Ge_y$ and the final layer is formed from $Si_{1-z}Ge_z$, with x and y respectively being in the range of 0 to 1, and x being substantially different from y, and with z satisfying the formula:

$$z=(x*th_1+y*th_2)/(th_1+th_2)$$

wherein $th_1$ is the thickness of the first layer;
$th_2$ is the thickness of the second layer;
and the respective lattice parameters of the first and second strained layers are respectively equal to the nominal lattice parameter of $Si_{1-z}Ge_z$.

* * * * *